United States Patent [19]

Koeneke et al.

[11] Patent Number: 4,665,414

[45] Date of Patent: May 12, 1987

[54] SCHOTTKY-BARRIER MOS DEVICES

[75] Inventors: Conrad J. Koeneke, Fanwood; Martin P. Lepselter; William T. Lynch, both of Summit, all of N.J.

[73] Assignee: American Telephone and Telegraph Company, AT&T Bell Laboratories, Murray Hill, N.J.

[21] Appl. No.: 820,597

[22] Filed: Jan. 21, 1986

Related U.S. Application Data

[60] Continuation of Ser. No. 633,657, Jul. 23, 1984, abandoned, which is a division of Ser. No. 401,142, Jul. 23, 1982, Pat. No. 4,485,550.

[51] Int. Cl.[4] .................... H01L 29/48; H01L 29/78; H01L 23/48
[52] U.S. Cl. .................................. 357/15; 357/23.1; 357/42; 357/67; 357/71; 357/88; 357/89; 357/91
[58] Field of Search ............... 357/15, 42, 67 S, 71 S, 357/23.1, 67, 71, 88, 89, 91

[56] References Cited

U.S. PATENT DOCUMENTS

| | | |
|---|---|---|
| 3,590,471 | 7/1971 | Lepselter et al. ............... 357/91 |
| 3,708,360 | 1/1973 | Wakefield et al. ............... 357/54 |
| 3,943,552 | 3/1976 | Shannon et al. ............... 357/15 |
| 3,964,084 | 6/1976 | Andrews, Jr. et al. ............... 357/89 |
| 4,107,835 | 8/1978 | Bindell et al. ............... 357/15 |
| 4,141,022 | 2/1979 | Sigg et al. ............... 357/23 S |
| 4,300,152 | 11/1981 | Lepselter ............... 357/15 |
| 4,343,082 | 8/1982 | Lepselter et al. ............... 357/15 |
| 4,476,482 | 10/1984 | Scott et al. ............... 357/71 S |

OTHER PUBLICATIONS

Darley et al., "Optimization of Self-Aligned Silicon MESFETS for VLSI at Micron Dimensions", *IEDM Tech. Digest*, Wash., DC USA, Dec. 8-10, 1980, pp. 34-37.

*Primary Examiner*—J. Carroll
*Attorney, Agent, or Firm*—Lucian C. Canepa

[57] ABSTRACT

Schottky-barrier MOS and CMOS devices are significantly improved by selectively doping the regions surrounding the Schottky-barrier source and drain contacts. For p-channel devices, acceptor doping is carried out in either a one-step or a two-step ion implantation procedure. For n-channel devices, donor doping is carried out in a two-step procedure. In each case, current injection into the channel is enhanced and leakage to the substrate is reduced while still maintaining substantial immunity to parasitic bipolar transistor action (MOS devices) and to latchup (CMOS devices).

8 Claims, 17 Drawing Figures

SCHOTTKY-BARRIER MOS DEVICES

This application is a continuation of application Ser. No. 633,657, filed July 23, 1984, which is a division of 401,142, filed July 23, 1982, now U.S. Pat. No. 4,485,550.

BACKGROUND OF THE INVENTION

This invention relates to integrated circuit structures and, more particularly, to metal-oxide-semiconductor (MOS) integrated circuit transistor devices which include Schottky-barrier (SB) source and drain contacts and to methods for making such devices.

It is known that utilizing SB contacts for the source and drain of a conventional p-channel or n-channel enhancement-mode MOS transistor device results in performance and fabrication advantages. It is also now known that the incorporation of such contacts in a standard integrated circuit employing complementary metal-oxide-semiconductor (CMOS) transistor devices in the same substrate chip is highly advantageous. As set forth in U.S. Pat. No. 4,300,152, issued to M. P. Lepselter, the inclusion of SB source and drain contacts in at least one of the complementary pair of MOS devices in a CMOS structure results in a meritorious arrangement that is incapable of latchup at any device packing density.

But, particularly for some low-voltage short-channel MOS and CMOS devices of practical importance, it has recently been determined that further improvements in the operating charchteristics of SB-MOS and SB-CMOS structures as heretofore proposed would be advantageous. In particular, it has been realized by applicants that improvements in the current sourcing capabilities and in the leakage characteristics of such devices are desirable. Accordingly, considerable effort has recently been directed at trying to improve these properties of the devices. It was recognized that this effort, if successful, could make the devices attractive contenders for large-scale commercial use in important applications such as random access memories and microprocessors.

SUMMARY OF THE INVENTION

Accordingly, an object of the present invention is to improve the operating characteristics of SB-MOS and SB-CMOS devices. More specifically, an object of this invention is to improve the current sourcing capabilities and leakage characteristics of such devices while still maintaining their substantial immunity to parastitic bipolar transistor action (MOS devices) and to latchup (CMOS devices).

Briefly, these and other objects of the present invention are embodied in specific illustrative SB-MOS and SB-CMOS devices. These principles are also embodied in particular illustrative methods for fabricating the devices.

In accordance with a feature of applicants' invention, SB-MOS and SB-CMOS devices are made by selectively doping the regions surrounding the SB source and drain contacts thereof. In one specific illustrative embodiment of applicants' invention, a p-channel SB-MOS device is made in accordance with a fabrication sequence in which selective acceptor doping of the regions surrounding the source and drain contacts is carried out in a one-step implantation procedure. In another specific illustrative embodiment of this invention, a n-channel SB-MOS device is made in accordance with a fabrication sequence in which selective donor doping of the regions surrounding the source and drain contacts is done in a two-step implantation procedure. In still another illustrative embodiment of the invention, a p-channel SB-MOS device characterized by a relatively low overlap resistance is made in accordance with a fabrication sequence that includes a two-step acceptor doping procedure. To fabricate a CMOS embodiment, both p-channel and n-channel doping procedures are employed. In each embodiment, current injection into the channel is enhanced and leakage to the substrate is reduced while still maintaining a substantial immunity of the device to parasitic bipolar transistor action (for an MOS device) and to latchup (for a CMOS device).

BRIEF DESCRIPTION OF THE DRAWING

A complete understanding of the present invention and of the above and other features thereof may be gained from a consideration of the following detailed description presented hereinbelow in connection with the accompanying drawing, not drawn to scale, in which.

DETAILED DESCRIPTION

Figure 1:
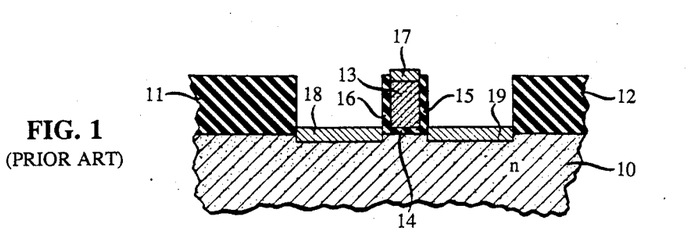
FIG. 1 shows in cross-section a portion of a priorly known SB-MOS device.

A portion of a SB-MOS p-channel device of a type known in the art is shown in FIG. 1. By way of example, the device comprises an n-type silicon substrate 10 having thereon standard relatively thick field-oxide regions 11 and 12, a doped polysilicon region 13, a relatively thin gate-oxide layer 14 underlying the polysilicon region 13 and additional oxide portions 15 and 16 formed on the side walls of the region 13.

A silicide layer 17 comprising, for example, platinum silicide is shown in FIG. 1 overlying the polysilicon region 13. Together, the region 13 and the layer 17 constitute an advantageous low-resistivity gate contact, as is well known in the art. Additionally, platinum silicide layers 18 and 19 serve as source and drain contacts, respectively, in the depicted structure, in the manner described, for example, by M. P. Lepselter and S. M. Sze in "SB-IGFET: An Insulated-Gate Field-Effect Transistor Using Schottky Barrier Contacts for Source and Drain," *Proceedings of the IEEE,* Aug. 1968, pages 1400-1402.

Further, structures of the type shown in FIG. 1 combined with similarly configured complementary n-channel structures formed in p-substrates or wells can be the basis for providing latchup-free CMOS devices, as described in detail in the aforecited Lepselter patent. Accordingly, throughout the discussion herein, it is to be understood that the structures and techniques being described are applicable both to SB-MOS devices of either the p-channel or n-channel type as specified or to SB-CMOS devices that include both p-channel and n-channel portions in the same chip substrate.

Known SB transistor devices of the kind partially represented in FIG. 1 exhibit advantageous characteristics. But, especially for low-voltage operation, such devices, particularly those of the short-channel type, also exhibit some properties that limit the applicability of the devices. These limiting properties include a current sourcing deficiency and in some cases an undesirably high leakage to the substrate from the drain contacts.

The current sourcing deficiency of the FIG. 1 arrangement has been determined by applicants to stem from at least two main factors. First, a physical separation or gap inevitably exists between the electrically induced p-channel formed directly under the polysilicon gate region 13 and the facing sides of the platinum silicide layers 18 and 19. Second, a Schottky-barrier height of 0.25 electron volts exists between the p-channel and the layers 18 and 19. The combined effect of these factors substantially limits the ability of the source of such a device to inject current into the channel.

Further, leakage from the drain contact 19 (FIG. 1) to the substrate 10 of the depicted device can be relatively high. For example, the drain-to-substrate leakage current of the SB device is typically approximately one hundred times that of an MOS device having standard diffused or implanted source and drain regions.

In accordance with the principles of the present invention, the current sourcing capabilities of a SB transistor device are enhanced. In addition, the drain-to-substrate leakage properties of the device are improved while still maintaining a relatively low Emitter Gummel Number for injection of minority carriers into the substrate. As a result, substantial immunity of the device to parasitic bipolar transistor action (for an MOS device) and to latchup (for a CMOS device) is maintained.

In a specific illustrative p-channel SB device made in accordance with this invention, to be described in detail below, these improvements are realized by following a light-doping one-step implantation procedure in which a thin large-concentration layer of acceptors is introduced immediately adjacent the sides of the platinum silicide layers 18 and 19 in the silicide-to-channel region. This doping reduces the potential barrier between the p-channel and the silicide layers 18 and 19 thereby allowing carriers to tunnel through the barrier. This effectively lowers the Schottky-barrier height between the p-channel and the layers 18 and 19 (to, for example, approximately 0.21 electron volts in the absence of an applied gate voltage) while also bridging the physical separation between the channel and the facing sides of these layers. At the same time, this light acceptor doping is effective to raise the Schottky-barrier height between the silicide layers and the n substrate 10, or to form a p-n junction with the substrate 10, thereby reducing leakage to the substrate without substantially raising the Emitter Gummel Number for injection into the substrate.

The aforespecified lowering of the Schottky-barrier height in the source-to-channel region, in accordance with the principles of the present invention, is an effective basis for enhancing current injection into the channel. When a voltage is applied to the gate contact of such an embodiment, a further reduction in barrier height occurs due to an induced image force lowering. Illustratively, the resulting barrier in the source-to-channel region is then only about 0.05 electron volts.

In another specific illustrative p-channel SB device that embodies the principles of the present invention, described later below, the light acceptor doping of the regions surrounding the silicide layers 18 and 19 is carried out in a unique two-step implantation procedure. In that way, the advantages specified in the paragraph immediately above are realized and, at the same time, the so-called series or overlap resistance, to be defined later below, is reduced.

In a specific illustrative n-channel SB device made in accordance with this invention, the aforespecified improvements are also attained in a two-step implantation procedure. This procedure and the device realized thereby are described in daitail later below.

Figure 2:
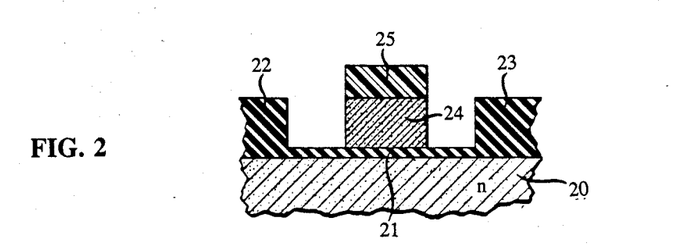
FIGS. 2 through 12 are cross-sectional depictions of a p-channel SB-MOS device made in accordance with the principles of the present invention at various successive stages of a fabrication sequence that includes a one-step implantation procedure.

FIG. 2 shows a particular illustrative p-channel SB device made in accordance with the principles of the present invention at an early stage of its fabrication. By way of a specific example, the depicted structure comprises an n-type silicon substrate 20, a 250-Angstrom-unit-thick gate-oxide layer 21, 3500-Angstrom-unit-thick field-oxide layers 22 and 23, a 3500-Angstrom-unit-thick doped polysilicon region 24 and a 10,000-Angstrom-unit-thick resist layer 25.

Figure 3:
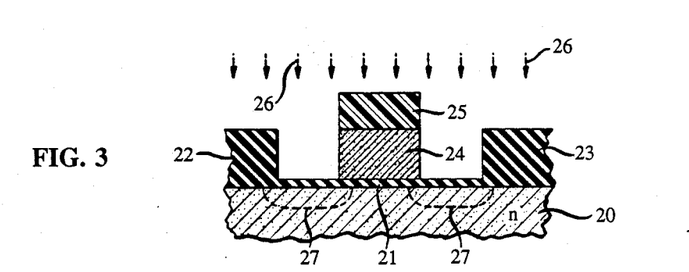

In accordance with the principles of the present invention, spaced-apart lightly doped p-regions are next formed in the substrate 20, as indicated in FIG. 3. Incident ions, represented by arrows 26, penetrate into the substrate 20 wherever only the relatively thin oxide layer 21 covers the surface thereof. The outlines of these implanted regions are denoted by dashed lines 27.

Illustratively, boron in the form of boron difluoride is directed at the FIG. 3 structure at a relatively light dose of approximately $3 \times 10^{13}$ boron atoms per square centimeter. Conventional source and drain implants are typically formed by incident doses a hundred times or so higher than this value.

In accordance with a feature of this invention, the peak concentration of the implanted dopant is designed to occur in the substrate 20 and at or near the interface between the oxide layer 21 and the substrate 20. One way of accomplishing this is simply to measure the thickness of the oxide layer 21 and then to select the ion implantation energy level to place the peak concentration at the desired level. Thus, for example, for a 250-Angstrom-unit-thick oxide layer 21 (FIG. 3), an incident ion energy level of about 30,000 electron volts for boron difluoride is effective to locate the peak concentration of the implanted regions at or near the specified interface. In one specific device structure, this concentration approximated $1.5 \times 10^{18}$ boron atoms per cubic centimeter within about 100 Angstrom units of the interface, with a Gaussian distribution of decreasing concentrations extending from the interface vertically and laterally. The importance of achieving such a peak concentration at or near the interface will be emphasized later below.

In some cases, the thickness of the oxide layer 21 (FIG. 3) overlying the regions to be implanted may not as a practical matter be sufficiently uniform to ensure that the implant will have the desired profile. In such cases, it is advantageous to remove the layer 21 by etching and then to form a new constant-thickness layer in a separate reoxidation step. Implanting through the new layer will provide the desired profile in the substrate 20.

Figure 4:
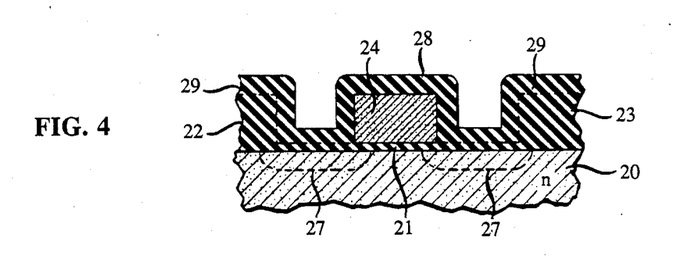

Next in the fabrication procedure, the resist layer 25 (FIG. 3) is removed and then a silicon dioxide layer 28 (FIG. 4) is deposited over the entire surface of the depicted structure. Illustratively, the layer 28 is formed in a standard chemical-vapor-deposition (CVD) step and has a minimum thickness of about 500 Angstrom units. In FIG. 4, dashed lines 29 indicate the extent of the oxide layer 21 and the field-oxide regions 22 and 23 before the oxide layer 28 is added thereto.

Alternatively, if a thinner oxide layer 28 is desired, as would be the case in FIG. 1 if a minimum separation is to be established between the silicide layers 18 and 19 and the channel region, the CVD oxide deposition step can be replaced by oxygen backsputtering of the oxide layer 21 (FIG. 3). Such an alternative step can reliably coat the depicted structure with a thin (as low as 100 Angstrom units) oxide layer, as described in detail in a commonly assigned copending application of E. Kinsbron, Ser. No. 328,368, filed Dec. 7, 1981, now U.S. Pat. No. 4,432,132.

The FIG. 4 structure is then subjected to a heat treatment at, for example, 900 degrees Celsius for about 10 minutes in a nitrogen atmosphere. This serves to anneal the previously specified implants, to densify the oxide layer 28 and to getter impurities from the substrate 20.

Alternatively, for some high-temperature-tolerant silicides (for example, cobalt disilicide) it is advantageous to carry out the aforespecified heat treatment step at a later stage in the fabrication procedure. In that way, gettering of impurities is more effectively carried out.

Subsequently, the oxide layer 28 of FIG. 4 is anisotropically etched in, for example, a reactive sputter (or ion) etching step in a $CHF_3$ plasma at a pressure of approximately 68 micrometers at a power density at the surface being etched of about 0.16 watts per square centimeter at a voltage of about 600 volts. Etching is carried out to entirely remove the layer 28 and the oxide layer 21 from the surface of the silicon substrate in regions overlying the aforespecified implants.

Figure 5:
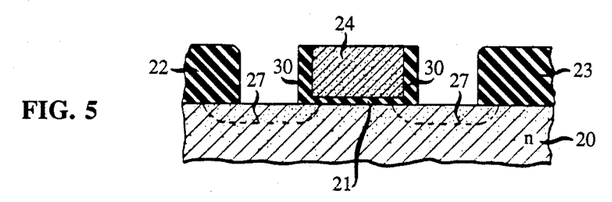

The resulting structure is shown in FIG. 5. The remaining portions of the oxide layer 28 (FIG. 4) include layers 30 on the side-walls of the polysilicon region 24. These dielectric layers 30 serve as insulators between subsequently formed silicide members and the region 24. Without the layers 30, the gate region 24 might be electrically shorted to the substrate 20 by the silicide members.

Figure 6:
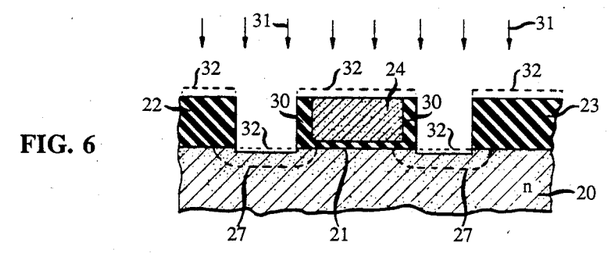

Cleaning of the exposed surface regions of the substrate 20 is then carried out. This is done, for example, in a conventional argon back-sputtering step, as represented in FIG. 6 wherein arrows 31 indicate incident argon ions. Illustratively, a portion about 150 Angstrom units in vertical extent of the exposed surface regions is removed. Additionally, similar amounts are removed from the surfaces of field-oxide regions 22 and 23, from the top surfaces of the side-wall oxide layers 30 and from the surface of the polysilicon region 24. Dashed lines 32 indicate the location of the surfaces of these regions before sputtering.

Figure 7:
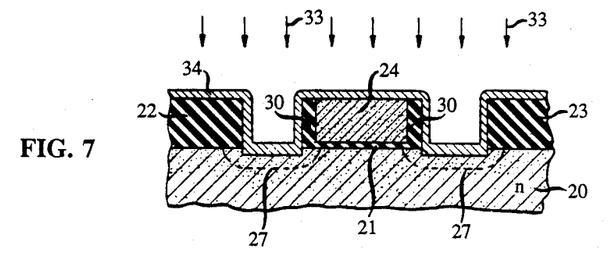

Next, platinum (represented by arrows 33 in FIG. 7) is sputter-deposited onto the structure. Illustratively, a 160-Angstrom-unit-thick layer 34 of platinum is thereby formed. Subsequently, the deposited layer is sintered in, for example, argon with 5 percent oxygen at 625 degrees Celsius for about 6 minutes. Those portions of the layer 34 that directly overlie the silicon substrate 20 and the polysilicon region 24 are thereby converted to platinum silicide. Wet etching with aqua regia is then effective to remove all of the layer 34 except for the portions thereof that were converted to platinum silicide. At this point in the fabrication procedure, the structure appears as shown in FIG. 8.

Figure 8:
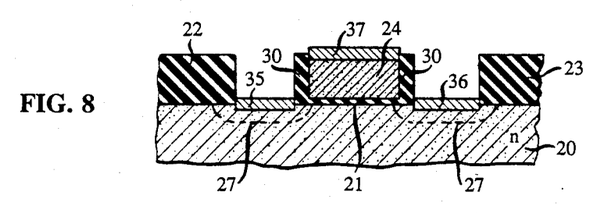

In FIG. 8, platinum silicide portions 35 and 36 constitute low-resistivity SB source and drain contacts. And platinum silicide portion 37 together with polysilicon region 24 constitute an advantageous low-resistivity gate contact.

In accordance with the principles of the present invention, the contacts 35 and 36 (FIG. 8) made of platinum silicide are respectively embedded in implanted regions that overall are relatively lightly doped. These relatively lightly doped regions each have, however, a relatively high concentration of dopants immediately adjacent the side of each silicide contact facing the p-channel region underlying the gate oxide layer 21. In particular, the high concentration of acceptor dopants is designed to occur adjacent each side of the silicide contact. As a result, the silicide-to-channel Schottky barrier is replaced by a much lower silicide-to-implant Schottky barrier in series with the tailing region of the implant that overlaps the gate. This overlap region gives rise to a component of series resistance, the so-called "overlap resistance".

Moreover, the acceptor dopants in the regions directly underlying the silicide source and drain contacts 35 and 36 (FIG. 8) are effective to raise the Schottky-barrier height between these contacts and the substrate 20. This is so if a sufficient concentration of acceptor atoms is established within a distance from the contact-to-substrate interface that is less than the depletion width in the contact-to-substrate region. Or the p-region established by the dopants can form a p-n junction with the n-substrate. In either case, current leakage to the substrate during device operation is thereby substantially reduced relative to the leakage of undoped SB contacts. At the same time, however, the Emitter Gummel Number for injection of minority carriers from these lightly doped regions into the substrate is not raised substantially.

A detailed description of the technique of raising or lowering the Schottky-barrier height in a SB diode is contained in U.S. Pat. No. 3,964,084 issued to R. M. Ryder and S. M. Sze. There is no suggestion therein, however, of applying the technique to a SB-MOS transistor device to achieve the advantageous results described herein. In particular, there is no teaching in the Ryder et al patent of simultaneously lowering and raising two different Schottky-barrier heights in a SB-MOS device in a single implantation step or, as described below, of both lowering and raising two such barriers in a two-step implantation procedure in which the same type dopant is successively implanted in the device.

Figure 9:
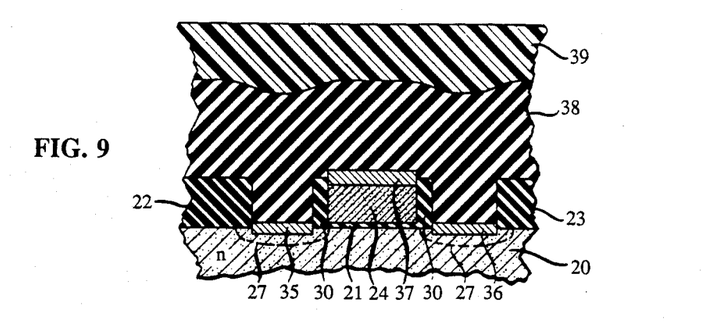

The next steps in one advantageous version of the herein-specified device fabrication procedure are illustrated by FIG. 9 which shows an oxide layer 38 and a spun-on resist layer 39 overlying the previously described structure. The oxide layer 38 is formed, for example, in a relatively low-temperature (less than 600 degrees Celsius) CVD step. Illustratively, the layer 38 is approximately one micrometer thick, as is the resist layer 39.

Subsequently, in accordance with the planarizing method described by A. C. Adams in "Plasma Planarization," *Solid State Technology*, Volume 24, pages 178–181, April 1981, the layer 39 and a portion of the layer 38 of FIG. 9 are removed in a reactive sputter etching step. The resulting structure, shown in FIG. 10, comprises a thinned oxide layer 38 having, advantageously, a planar top surface.

Figure 10:
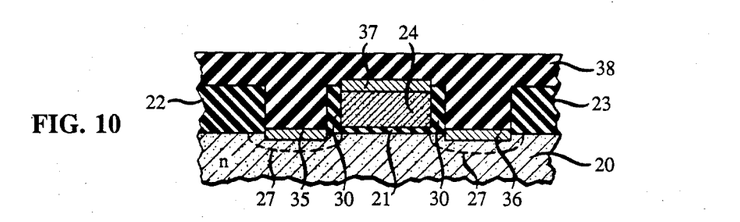
Figure 11:
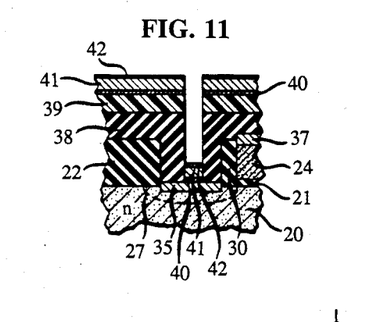

Further standard steps known in the art are then utilized to define contact windows in the oxide layer 38 of FIG. 10. As indicated in FIG. 11, a patterned resist layer 39 is employed as a mask during an anisotropic etching step in which a window is formed in the layer 38 centrally positioned with respect to the source contact 35. Then, after cleaning the exposed surface portion of the contact 35 in a conventional argon-back-sputtering step, an advantageous trilevel interlayer metallization is applied to the entire top surface of the structure in preparation for a subsequent aluminum metallization step.

Illustratively, the trilevel metallization shown in FIG. 11 comprises, from bottom to top, a 200- Angstrom-unit-thick layer 40 of titanium nitride, a 2000- Angstrom-unit-thick layer 41 of titanium and another 200- Angstrom-unit-thick layer 42 of titanium nitride. The portions of this metallization overlying the resist layer 39 and the resist layer itself are then removed in a standard lift-off step. Of course, other methods may also be used to provide a barrier layer between the silicide and the subsequent aluminum.

Figure 12:
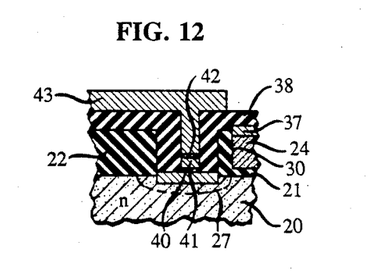

Subsequently, a one-micrometer-thick layer of aluminum is deposited on the entire top surface of the structure and then patterned in a conventional way, as indicated in FIG. 12. The patterned aluminum layer 43 provides an electrical connection to the source contact 35 via the aforespecified trilevel metallization. Similar connections, not shown, are also thereby made to other source contacts and to drain and gate contacts included in the herein-considered integrated circuit device.

For some applications, a p-channel device of the type described above may exhibit an undesirably high overlap series resistance in the source-to-channel region. Applicants have determined that this resistance is attributable to the tailing portions of the dopant concentration distribution introduced into the noted regions. Applicants have found that this resistance can be reduced by establishing a more abrupt fall-off of the tail of the distribution in the source-to-channel overlap region. In particular, the peak is designed as before to occur at or near the interface between the side of each silicide source contact and the p-channel region, with, however, a more abrupt fall-off than before in dopant concentration as distance increases from the interface towards the channel.

Figure 13:
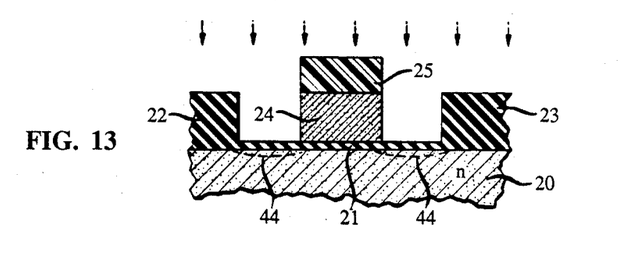
FIGS. 13 through 15 illustrate in cross-section a p-channel SB-MOS device made in accordance with the principles of the present invention at various successive stages of a fabrication sequence that includes a two-step implantation procedure.

More specifically, the series resistance of an illustrative p-channel device may be reduced by reducing the energy of the incident acceptor ions. Thus, by utilizing the same incident dose as specified above but at an energy of only about 5,000 electron volts, and with no implantation oxide, a reduction in series resistance by a factor of about six can in fact be realized while achieving a larger lowering of the Schottky-barrier height in the source-to-channel region. The relatively shallow doped regions formed thereby are represented in FIG. 13 by dashed lines 44. Illustratively, the acceptor concentration within about 150 Angstrom units of the silicide-to-channel interface is in this case approximately $2.5 \times 10^{18}$ acceptor atoms per cubic centimeter.

Silicide contacts subsequently formed in the FIG. 13 structure, in the illustrative manner described earlier above, may actually extend through the shallow doped regions and contact the n substrate. If such a so-called punch-through occurs, the previously specified meritorious advantages of having a lightly doped p-region underlying the silicide contacts are of course lost.

Thus, in accordance with another feature of the principles of the present invention, it is advantageous to further modify the earlier-described procedure for fabricating a p-channel device by carrying out a second acceptor implantation step. In this second step, the parameters of the implant are optimized to minimize current leakage into the substrate while maintaining a low Emitter Gummel Number for minority carrier injection into the substrate.

Figure 14:
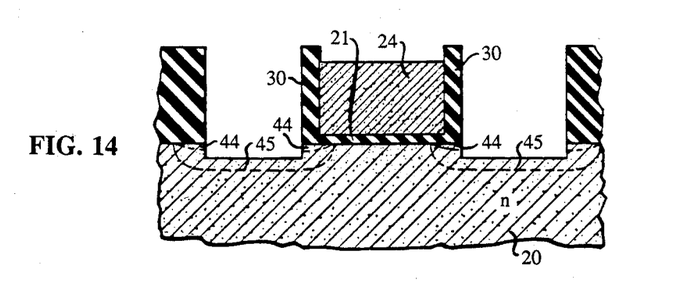

As indicated in FIG. 14, sputter cleaning of the surface of the substrate 20 in the source and drain regions can form substantial indents in the surface. These indents themselves, or in conjunction with subsequent formation of silicide during sintering, may extend below the outline 44 of the first implanted regions.

Hence, in accordance with the present invention, a second implant is carried out in the FIG. 14 structure (after the formation of the side-wall oxide portions 30). Illustratively, this implant is of boron difluoride at a relatively light dose of $10^{13}$ boron atoms per square centimeter and at an energy of 60,000 electron volts. The outline of this second implanted region is indicated by dashed line 45 in FIG. 14. Illustratively, the average acceptor concentration within this region is approximately $1.5 \times 10^{18}$ acceptor atoms per cubic centimeter.

Figure 15:
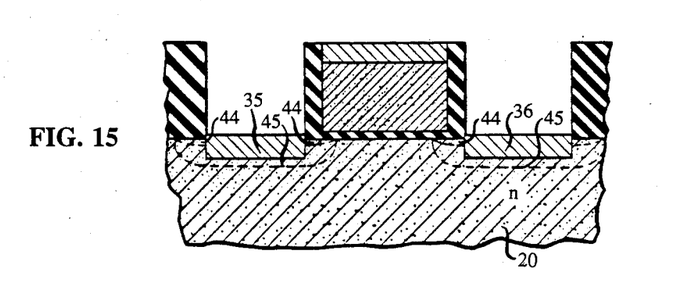

The second implanted region shown in FIG. 14 is sufficiently deep that when the silicide contacts are subsequently formed, no punch-through will occur. This is illustrated in FIG. 15 wherein doped regions are shown underlying the silicide contacts 35 and 36.

In accordance with the principles of the present invention, an advantageous SB-MOS transistor device of the n-channel type is fabricated in accordance with a procedure that also includes a two-step implantation sequence. The device so made is similar in many respects to those described above and many of the same earlier-specified fabrication techniques are applicable thereto.

Figure 16:
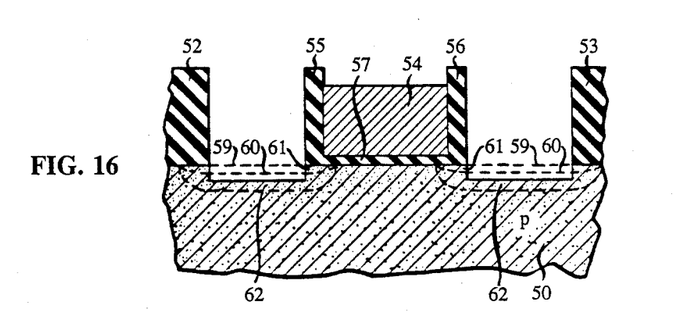
FIGS. 16 and 17 are cross-sectional depictions of a partially fabricated n-channel SB-MOS device made in accordance with the principles of applicants' invention in a mehtod that also includes a two-step implantation procedure.

By way of a specific illustrative example of an embodiment of this invention made in accordance with such a two-step sequence, FIG. 16 shows a partially fabricated n-channel device. The device comprises a p-type silicon substrate 50 having thereon field-oxide regions 52 and 53, a doped polysilicon region 54 having side-wall oxide portions 55 and 56 and a gate-oxide layer 57.

Dashed lines 59 in FIG. 16 indicate portions of the original surface of the substrate 50. A first ion implantation step is carried out while those surface portions are as defined by the lines 59.

In the first ion implantation step, a donor impurity such as arsenic is directed at an earlier version of the FIG. 16 structure (one that does not include the oxide portions 55 and 56) at a dose of about $10^{14}$ arsenic atoms per square centimeter at an energy of approximately 10,000 electron volts. Shallow (approximately 300- Angstrom-units-deep) implanted regions each with a relatively high concentration of dopants immediately below and to the sides of the surface portions 59 are thereby achieved. (The vertical and lateral extents of the first ion-implanted regions are represented by dashed lines 60 in FIG. 16.) Illustratively, this high concentration approximates $2.5 \times 10^{19}$ arsenic atoms per cubic centimeter within about 100 Angstrom units of the surface 59 and is effective to lower the relatively high 0.85 electron-volt Schottky barrier that otherwise would exist between subsequently formed silicide contacts and the n-channel region underlying the polysilicon region 54.

After the first aforespecified ion implant, the oxide side-walls 55 and 56 are formed in, for example, the manner described earlier above. Next, the silicon surface portions 59 are anisotropically etched in a standard reactive sputter etching step to a depth of about 600 Angstrom units or more. At that point in the fabrication sequence, the surface portions so etched are recessed below the main surface of the substrate 50, as shown in FIG. 16.

After the specified etching step, only side portions of the first implanted regions remain in the substrate 50 of FIG. 16. The side portions adjacent the channel region in the FIG. 16 structure are each designated by reference numeral 61. These remaining side portions 61 are the Schottky-barrier-lowering portions of the first implant. In accordance with a feature of the present invention, the concentration and profile of the impurities in these side portions are tailored to optimize current injection into the channel while minimizing the overlap resistance.

Subsequently, in a second ion-implantation step, lightly doped donor regions 62 are formed in the FIG. 16 structure. These regions 62 are established to optimize the low-leakage current characteristic of the depicted device. Illustratively, the second implant comprises an incident dose of about $5 \times 10^{12}$ arsenic atoms per square centimeter at an energy whose value depends on the silicide thickness desired. This produces relatively deep and light implants that are effective in the completed device to surround the subsequently formed silicide contacts and thereby to significantly limit leakage current from the contacts to the substrate 50. Illustratively, these implants are tailored to form extremely low-leakage p-n junctions below the contacts. At the same time, the implants are designed to maintain a relatively low Emitter Gummel Number for injection of minority carriers into the substrate.

Figure 17:
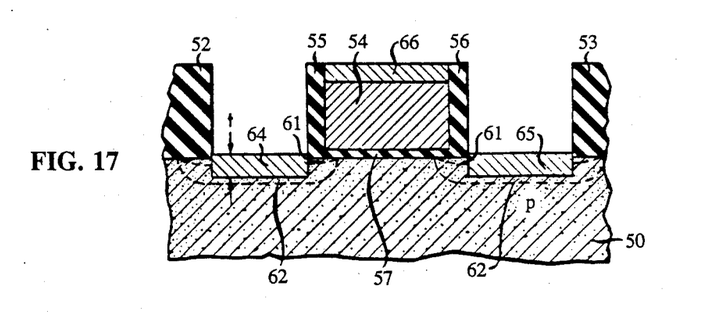

Next, after a standard annealing step, platinum silicide contacts are formed in the herein-described structure in, for example, the manner described above. Source and drain contacts 64 and 65, respectively, are shown in FIG. 17. Illustratively, the thickness t of each of these contacts as well as the thickness of a silicide portion 66 overlying the polysilicon region 54 is approximately 1000 Angstrom units.

Subsequently, electrical connections are established to the source, drain and gate contacts of the n-channel structure shown in FIG. 17. This may be done, for example, by following the same overall procedure specified above in connection with the description of FIGS. 9 through 12.

Finally, it is to be understood that the above-described techniques and structures are only illustrative of the principles of the present invention. In accordance with these principles, numerous modifications and alternatives may be devised by those skilled in the art without departing from the spirit and scope of the invention. For example, in the two-step implantation procedures described above, the same dopant type, but not necessarily the same species, is implanted in each step. Moreover, silicides other than platinum silicide may be used. If, for example, cobalt disilicide is used in an n-channel device, the dose employed for the first implant of the two-step procedure is in practice reduced (typically by a factor of about two) relative to that employed for a device that includes platinum silicide. This is so because the cobalt disilicide-to-n-channel barrier is 0.68 electron volts rather than 0.85 electron volts for platinum silicide. Additionally, with cobalt disilicide, after source and drain portions of the silicon substrate are anisotropically etched (as shown in FIG. 16), cobalt disilicide can be formed while simultaneously annealing the first implant. Subsequently, the second implant is carried out through the cobalt disilicide at a sufficiently high energy to totally embed the cobalt disilicide. Annealing of the second implant can then be done after the overlying dielectric (layer 38 in FIG. 9) is deposited. This improves the gettering effect of this last heat treatment. Also, since cobalt disilicide has a higher temperature-tolerant characteristic than platinum silicide, an overlying dielectric having an advantageous passivating property (achieved by high-temperature densification of the dielectric) can be selected for inclusion in the device.

What is claimed is:

1. An integrated circuit structure comprising multiple Schottky-barrier metal-oxide-semiconductor devices defined in a semiconductive region of one conductivity type, each of said devices comprising spaced-apart source and drain contacts each comprising a metallic silicide member formed in surface portions of said region, said silicide members of each device having facing side portions in said region, means for electrically inducing a channel of the opposite conductivity type in said region between the facing side portions of the silicide members of each device, and a doped region of the opposite conductivity type in said semiconductive region along the entire interface between said silicide members and said semiconductive region, said doped region being sufficiently lightly doped to ensure a substantial immunity to parasitic bipolar transistor action and to latchup, said doped region including laterally extending doped portions immediately adjacent the facing side portions of the silicide members of each device for lowering the silicide member-to-channel Schottky-barrier height thereby to increase the current sourcing capability of the device while maintaining a Schottky barrier in the path of current flow between the silicide members of each device, and other doped portions between said silicide members and said semiconductive region for reducing leakage current between said silicide members and said semiconductive region.

2. A structure as in claim 1 wherein the peak concentration of the dopant in each of said laterally extending portions occurs at a distance from said interface that is less than the depletion width in the source contact-to-channel region.

3. A structure as in claim 2 wherein the peak concentration of the dopant in each of said other doped portions occurs at a distance from said interface that is less than the depletion width in the drain contact-to-semiconductive region.

4. A structure as in claim 2 wherein said other doped portions form p-n junctions with said semiconductive region.

5. A structure as in claim 3 or 4 wherein said semiconductive region is made of n-type silicon, said induced channel is a p-channel and said doped region is formed by implanting acceptor impurities therein in a single ion-implantation step.

6. A structure as in claim 5 wherein said contacts are made of platinum silicide, wherein said doped region is doped with boron, wherein the boron concentration in the laterally extending doped portions is approximately $2.5 \times 10^{18}$ boron atoms per cubic centimeter within about 150 Angstrom units of said interface, and wherein the average boron concentration in said other doped portions is approximately $1.5 \times 10^{18}$ boron atoms per cubic centimeter within about 0.1 micrometers below said silicide.

7. A structure as in claim 3 or 4 wherein said semiconductive region is made of p-type silicon, said induced channel is an n-type channel and said doped region is formed by implanting donor impurities therein in a two-step ion implantation procedure.

8. A structure as in claim 7 wherein said contacts are made of a material selected from the group consisting of platinum silicide and cobalt disilicide, wherein said doped region is doped with arsenic, wherein the arsenic concentration in the laterally extending doped portions is approximately $4 \times 10^{19}$ arsenic atoms per cubic centimeter within about 100 Angstrom units of said interface, and wherein the average arsenic concentration in said other doped portions is approximately $1.5 \times 10^{18}$ arsenic atoms per cubic centimeter within about 0.1 micrometers below said silicide.

* * * * *